(12) United States Patent
Takahashi et al.

(10) Patent No.: US 8,698,571 B2
(45) Date of Patent: Apr. 15, 2014

(54) CIRCUIT FOR IMPROVING THE IMMUNITY PERFORMANCE OF A VEHICLE NETWORK

(75) Inventors: Masayoshi Takahashi, West Bloomfield, MI (US); Hua Zeng, Novi, MI (US)

(73) Assignee: Hitachi, Ltd., Tokyo (JP)

( * ) Notice: Subject to any disclaimer, the term of this patent is extended or adjusted under 35 U.S.C. 154(b) by 293 days.

(21) Appl. No.: 13/075,238

(22) Filed: Mar. 30, 2011

(65) Prior Publication Data

US 2012/0249257 A1 Oct. 4, 2012

(51) Int. Cl.
*H04B 3/28* (2006.01)

(52) U.S. Cl.
USPC .............. 333/12; 333/177; 333/181; 333/185

(58) Field of Classification Search
USPC .................... 333/12, 177, 181, 185
See application file for complete search history.

(56) References Cited

U.S. PATENT DOCUMENTS

| | | | | |
|---|---|---|---|---|
| 5,825,259 A | * | 10/1998 | Harpham | 333/22 R |
| 7,123,117 B2 | * | 10/2006 | Chen et al. | 333/177 |
| 7,385,466 B2 | * | 6/2008 | Suenaga et al. | 333/181 |
| 7,388,449 B2 | * | 6/2008 | Hamada et al. | 333/12 |
| 7,592,713 B2 | * | 9/2009 | Bryan et al. | 307/9.1 |
| 7,804,188 B2 | * | 9/2010 | Sakai et al. | 307/10.1 |
| 7,808,751 B2 | * | 10/2010 | Chen et al. | 361/56 |
| 7,884,687 B2 | * | 2/2011 | Lee | 333/177 |
| 7,994,876 B2 | * | 8/2011 | Feng et al. | 333/181 |
| 8,228,019 B2 | * | 7/2012 | Higuchi et al. | 318/722 |
| 2012/0189021 A1 | * | 7/2012 | Hartwich | 370/438 |

FOREIGN PATENT DOCUMENTS

| | | | |
|---|---|---|---|
| CN | 201878154 U | * | 6/2011 |
| JP | 2001069762 A | * | 3/2001 |

* cited by examiner

*Primary Examiner* — Robert Pascal
*Assistant Examiner* — Kimberly Glenn
(74) *Attorney, Agent, or Firm* — Gifford, Krass, Sprinkle, Anderson & Citkowski, P.C.

(57) ABSTRACT

In a vehicle network for controlling electronic devices of the type having a network driver with at least one output line connected to the network through a common mode choke. A circuit for improving the immunity of the network includes a resistor and a capacitor connected in series between the signal output line and ground. The series resistor and capacitor protect the network from communication errors.

16 Claims, 1 Drawing Sheet

CIRCUIT FOR IMPROVING THE IMMUNITY PERFORMANCE OF A VEHICLE NETWORK

BACKGROUND OF THE INVENTION

I. Field of the Invention

The present invention relates to a circuit to improve immunity performance in a network.

II. Description of Related Art

Most modern day vehicles include a network for controlling the electronic devices within the vehicle. Two common networks include the Can Area Network (CAN) and the Flex-Ray network.

An exemplary prior art CAN termination without terminal resistor is illustrated in FIG. 1 and includes a CAN driver 10 having differential input/output signal lines 12. The signal lines 12 are connected through a common mode choke 14 to a signal harness 16 which interconnects the CAN driver 10 to the various electronic devices within the vehicle.

Most vehicle networks, furthermore, operate at a predetermined frequency, e.g. 500 kHz for CAN. In order to reduce high frequency noise, a terminal capacitor 18 is typically connected between each signal line 12 and ground on the side of the common mode choke 14 opposite to the driver 10.

The common mode choke 14 in the network is designed to reduce emission noise. However, in some instances, the inductance of the common mode choke 14 together with the stray capacitance 11 of the driver 10 creates an LC resonance. That resonance, in turn, can cause communication errors, particularly during the immunity testing of the network, such as Bulk Current Injection (BCI) testing.

SUMMARY OF THE PRESENT INVENTION

The present invention provides a circuit which exhibits improved immunity performance of the termination circuit for a communication network, such as a CAN or Flex-Ray network for a vehicle.

In brief, the circuit of the present invention comprises both a resistor and a capacitor that are connected in series with each other. One end of the series combination of the resistor and capacitor is connected to the differential signal line between the driver and the common mode choke. The other end of the series and capacitor combination is connected to ground.

In practice, the values for the resistor and capacitor are selected to reduce peaks that may otherwise be caused by resonance in the network. To this end, the resistance of the resistor is selected such that it is smaller or equal to the impedance of the stray capacitance of the driver at a resonant frequency of the network.

Additionally, the resistance of the resistor should be larger than the square root of the inductance of the common mode choke divided by the capacitance of the terminal capacitance in the network. Lastly, the values of the resistor and capacitor are selected so that their impedance at the network frequency is much greater than the termination impedance of the network itself. Typically, a network such as a CAN network has some electronics devices, and only two devices have the 120-ohm terminal resistor on the differential line between the terminal capacitor 18 and the common mode choke 14. Consequently, the impedance at the resonant frequency for the resistor and capacitor combination is selected so it is much greater than the termination impedance of the network. Preferably, the impedance of the resistor and capacitor combination is greater than ten times the termination impedance of the network at the communication frequency for the network.

BRIEF DESCRIPTION OF THE DRAWING

A better understanding of the present invention will be had upon reference to the following detailed description when read in conjunction with the accompanying drawing, wherein like reference characters refer to like parts throughout the several views, and in which.

DETAILED DESCRIPTION OF A PREFERRED EMBODIMENT OF THE PRESENT INVENTION

Figure 1:
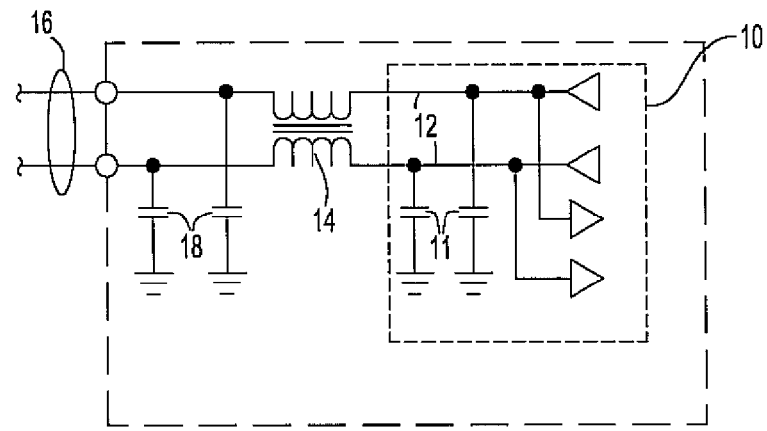
FIG. 1 is a prior art view illustrating a vehicle network.
Figure 2:
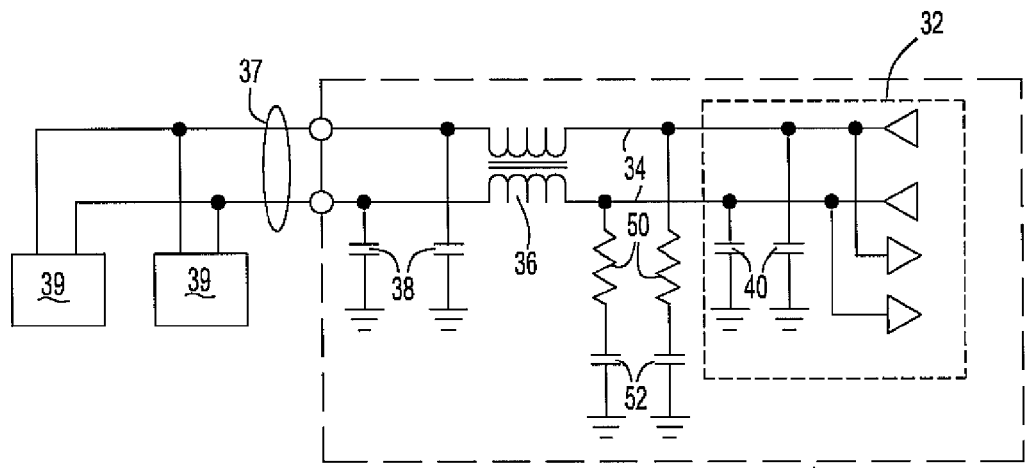
FIG. 2 is a schematic view illustrating a preferred embodiment of the present invention.

With reference first to FIG. 2, a preferred embodiment of the circuit of the present invention is there shown for use with a vehicle network 30, illustrated as a CAN network 30. As such, the network 30 includes a driver 32 having the differential input/output line 34. The network 30 illustrated in FIG. 2 includes the differential signal line 34 from the CAN driver 32.

The signal lines 34 are connected through a common mode choke 36 to a signal harness 37. The signal harness 37, in turn, is connected to a plurality of electronic devices 39 throughout the vehicle. In this fashion, the driver 32 can communicate with the various electronic devices 39 through the signal harness 37.

In the conventional fashion, at least one terminal capacitor having a capacitance $C_T$ is connected between each signal line 34 and ground on the side of the common mode choke opposite from the driver 32. The terminal capacitors 38 together with the common mode choke 36 serve to reduce high frequency noise that may be present on the signal lines 34.

The network driver 32 also includes an inherent stray capacitance for each signal line 34. This inherent capacitance is illustrated at 40 and has a value of $C_i$.

The network thus far described is conventional. Unlike the prior art vehicle networks, however, in the present invention a resistor having a value $R_X$ and a capacitor having a value $C_X$ are connected in series with each other. One end of that series resistor and capacitor combination is electrically connected to each signal line 34 between the driver 32 and the common mode choke 36. The other end of the resistor and capacitor series combination of Rx and $C_X$ is connected to ground.

Careful selection for the values $R_X$ and $C_X$ is important to both improve the immunity performance of the network and also to prevent any degradation of the network performance. Consequently, several parameters must be considered for the proper selection of both the resistor 50 and the capacitor 52.

More specifically, the resistance Rx of the resistor 50 is selected so that it is less than or equal to the impedance of the stray capacitor 40 at a resonant frequency $f_R$ which may be determined empirically. Thus, the value of the resistor 50 should meet the requirements of the following formula:

$$R_x \le \frac{1}{2\pi f_R C_i}$$

where $R_X$=the value of the resistor 50;

$f_R$=the resonant frequency; and $C_i$=the capacitance of the stray capacitor 40 of the driver 32.

In addition to the resonance caused by the stray capacitance 40 of the driver 32, the combination of the common mode choke 36 and the terminal capacitors 38 must be addressed so that the resistance Rx of the resistor 50 is greater than the square root of the inductance of the common mode choke 36 divided by the capacitance of the terminal capacitors 38 in order to properly dampen that potential resonance. As such, the value Rx of the resistor 50 should also meet the following formula:

$$R_x \geq \sqrt{\frac{L}{C_T}}$$

where L=the inductance of the common mode choke 36; and
$C_T$=the capacitance of the terminal capacitor 38.

Lastly, the impedance of the network at its operating frequency, typically 500 kHz for a CAN network, represents a fixed parameter for the network. For example, in a CAN network, a 120 ohm impedance at the communication frequency is expected by the network design.

Consequently, the value for the resistor 50 and capacitor 52 combination must be selected so that it is much greater, up to ten times greater, than the termination impedance at the communication frequency for the network. Thus, the value of the resistor 50 and capacitor 52 is selected to satisfy the following equation:

$$Z \approx \sqrt{R_x^2 + \frac{1}{(2\pi f_{COM} C_x)^2}}$$

where $R_X$=the value of the resistor 50;
$C_X$=the value of the capacitor 52; and
$f_{COM}$=the communication frequency of the network.
Preferably, Z is up to ten times the impedance of the network at the communication frequency $f_{COM}$.

Figure 3:
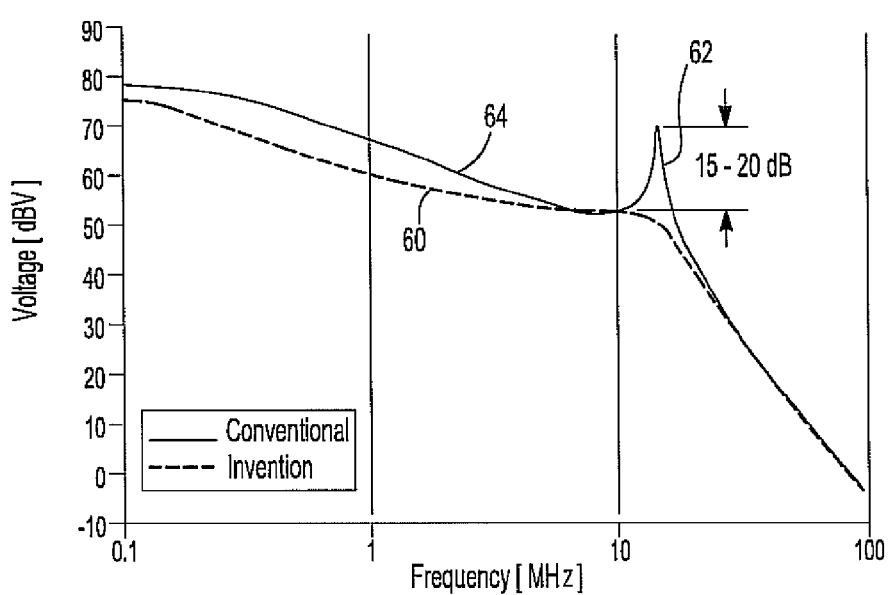
FIG. 3 is a graph of a computer simulation illustrating the effect of the present invention.

With reference now to FIG. 3, a graph is illustrated illustrating the effect of the present invention in a simulation circuit. Graph 64 illustrates the network without the resistor and capacitor combination in accordance with the present invention. As shown, the network without the resistor and capacitor series combination exhibits a spike 62 at a resonant frequency just greater than 10 MHz. The spike 62, furthermore, is in the range of 15-20 dB.

Conversely, graph 60 illustrates the network immunity in accordance with the present invention. As shown, the present invention almost entirely eliminates the spike 62 at the resonant frequency.

From the foregoing, it can be seen that the present invention provides a simple yet effective circuit for reducing the impact of unwanted noise due to resonance in a vehicle network. Furthermore, the present invention achieves this without degradation of the overall performance of the network itself.

Having described our invention, however, many modifications thereto will become apparent to those skilled in the art to which it pertains without deviation from the spirit of the invention as defined by the scope of the appended claims.

We claim:

1. In a network in a vehicle of the type having a common mode choke and a network driver having the differential input/output signal line connected to the network through a common mode choke, a circuit for improving the immunity of the network from communication errors comprising:
   a resistor,
   a capacitor,
   said resistor and capacitor being connected in series between the differential signal line and a ground between driver and the common mode choke,
   wherein the network operates at a predetermined frequency $f_{COM}$ and wherein an impedance of said capacitor and said resistor in series at said predetermined frequency $f_{COM}$ is greater than a system operating impedance of the network for both differential mode and common mode.

2. The circuit as defined in claim 1 wherein the network comprises a CAN network.

3. The circuit as defined in claim 1 wherein said impedance is greater than 120 ohms.

4. The circuit as defined in claim 1 wherein the network exhibits a known resonance at a resonance frequency $f_R$ due at least in part to stray capacitance of the driver and wherein a resistance of said resistor is less than or equal to an impedance of said capacitor at said resonance frequency $f_R$.

5. The circuit as defined in claim 1 wherein the network includes a terminal capacitor connected between the signal line and ground on a side of the common choke mode opposite from the network driver and wherein a resistance of said resistor is greater than $$R_x \geq \sqrt{\frac{L}{C_T}}$$

where L=inductance of the common mode coil
$C_T$=capacitance of the terminal capacitor.

6. The circuit as defined in claim 1 wherein the network exhibits a known resonance at a resonance frequency $f_R$ due at least in part to stray capacitance of the driver and wherein the resistance of said resistor is less than or equal to the impedance of said capacitor at said resonance frequency $f_R$.

7. The circuit as defined in claim 6 wherein the network includes a terminal capacitor connected between the signal line and ground on a side of the common choke mode opposite from the network driver and wherein the resistance of said resistor is greater than $$R_x \geq \sqrt{\frac{L}{C_T}}$$

where L=inductance of the common mode coil
$C_T$=capacitance of the terminal capacitor.

8. The circuit as defined in claim 1,
   wherein the impedance of said capacitor and said resistor in series at said predetermined frequency $f_{COM}$ is at least 10 times greater than the system operating impedance of the network.

9. A vehicle having a network of the type having a common mode choke and a network driver having the differential input/output signal line connected to the network through a common mode choke, a circuit for improving the immunity of the network from communication errors comprising:
   a resistor,
   a capacitor,
   said resistor and capacitor being connected in series between the differential signal line and a ground between driver and the common mode choke,
   wherein the network operates at a predetermined frequency $f_{COM}$ and wherein an impedance of said capacitor and said resistor in series at said predetermined frequency $f_{COM}$ is greater than a system operating impedance of the network for both differential mode and common mode.

10. The vehicle as defined in claim 9 wherein the network comprises a CAN network.

11. The vehicle as defined in claim 9 wherein said impedance is greater than 120 ohms.

12. The vehicle as defined in claim 9 wherein the network exhibits a known resonance at a resonance frequency $f_R$ due at least in part to stray capacitance of the driver and wherein a resistance of said resistor is less than or equal to an impedance of said capacitor at said resonance frequency $f_R$.

13. The vehicle as defined in claim 9 wherein the network includes a terminal capacitor connected between the signal line and ground on a side of the common choke mode opposite from the network driver and wherein a resistance of said resistor is greater than $$R_x \geq \sqrt{\frac{L}{C_T}}$$

where L=inductance of the common mode coil
$C_T$=capacitance of the terminal capacitor.

14. The vehicle as defined in claim 9 wherein the network exhibits a known resonance at a resonance frequency $f_R$ due at least in part to stray capacitance of the driver and wherein the resistance of said resistor is less than or equal to the impedance of said capacitor at said resonance frequency $f_R$.

15. The vehicle as defined in claim 14 wherein the network includes a terminal capacitor connected between the signal line and ground on a side of the common choke mode opposite from the network driver and wherein the resistance of said resistor is greater than $$R_x \geq \sqrt{\frac{L}{C_T}}$$

where L=inductance of the common mode coil
$C_T$=capacitance of the terminal capacitor.

16. The vehicle as defined in claim 9,
wherein the impedance of said capacitor and said resistor in series at said predetermined frequency $f_{COM}$ is at least 10 times greater than the system operating impedance of the network.

* * * * *